(12) United States Patent
Haba et al.

(10) Patent No.: US 7,462,932 B2
(45) Date of Patent: Dec. 9, 2008

(54) MANUFACTURE OF MOUNTABLE CAPPED CHIPS

(75) Inventors: Belgacem Haba, Saratoga, CA (US); Yoichi Kubota, Pleasanton, CA (US)

(73) Assignee: Tessera, Inc., San Jose, CA (US)

(\*) Notice: Subject to any disclaimer, the term of this patent is extended or adjusted under 35 U.S.C. 154(b) by 0 days.

(21) Appl. No.: 11/642,354

(22) Filed: Dec. 20, 2006

(65) Prior Publication Data

US 2007/0096296 A1 May 3, 2007

Related U.S. Application Data

(62) Division of application No. 10/786,825, filed on Feb. 25, 2004.

(60) Provisional application No. 60/449,673, filed on Feb. 25, 2003, provisional application No. 60/456,737, filed on Mar. 21, 2003.

(51) Int. Cl.
*H01L 23/12* (2006.01)

(52) U.S. Cl. .............................. 257/704; 257/E23.013; 257/E23.014; 257/E23.022; 257/E23.031; 257/E23.047

(58) Field of Classification Search ................ 257/416, 257/678, 734, 787, 704, 735, 690, 692, 693
See application file for complete search history.

(56) References Cited

U.S. PATENT DOCUMENTS

| | | | |
|---|---|---|---|
| 3,648,131 A | 3/1972 | Stuby et al. | |
| 3,761,782 A | 9/1973 | Youmans | |
| 5,220,838 A | 6/1993 | Fung et al. | |
| 5,668,033 A | 9/1997 | Ohara et al. | |
| 5,734,196 A * | 3/1998 | Horton et al. | 257/666 |
| 5,801,474 A | 9/1998 | Sakairi et al. | |
| 5,910,687 A | 6/1999 | Chen et al. | |
| 5,915,168 A | 6/1999 | Salatino et al. | |
| 5,991,989 A | 11/1999 | Onishi et al. | |
| 6,011,330 A | 1/2000 | Goodman et al. | |
| 6,124,179 A | 9/2000 | Adamic, Jr. | |
| 6,156,652 A | 12/2000 | Michalicek | |
| 6,221,751 B1 | 4/2001 | Chen et al. | |
| 6,225,694 B1 | 5/2001 | Terui et al. | |
| 6,297,551 B1 | 10/2001 | Dudderar et al. | |
| 6,316,840 B1 | 11/2001 | Otani et al. | |
| 6,326,689 B1 | 12/2001 | Thomas | |
| 6,366,629 B1 | 4/2002 | Chen et al. | |

(Continued)

FOREIGN PATENT DOCUMENTS

JP 07-202157 8/1995

*Primary Examiner*—David A Zarneke
(74) *Attorney, Agent, or Firm*—Lerner, David, Litenberg, Krumholz & Mentlik, LLP

(57) ABSTRACT

A wafer or a portion of a wafer including capped chips such as surface acoustic wave (SAW) chips is provided with terminals by applying a terminal-bearing element such as a dielectric element with terminals and leads thereon, or a lead frame, so that the terminal-bearing element covers the caps, and the leads are aligned with channels or other depressions between the caps. The leads are connected to contacts on the wafer, and the wafer is severed to form individual units, each including terminals supported by the cap and connected to the contacts by the leads. The resulting units can be handled and processed in the same manner as ordinary chips or chip assemblies.

9 Claims, 11 Drawing Sheets

U.S. PATENT DOCUMENTS

| | | | |
|---|---|---|---|
| 6,368,896 B2 | 4/2002 | Farnworth et al. | |
| 6,396,043 B1 | 5/2002 | Glenn et al. | |
| 6,403,400 B2 * | 6/2002 | Lin | 438/121 |
| 6,429,036 B1 | 8/2002 | Nixon et al. | |
| 6,441,481 B1 * | 8/2002 | Karpman | 257/711 |
| 6,452,238 B1 | 9/2002 | Orcutt et al. | |
| 6,472,727 B2 * | 10/2002 | Miyazaki et al. | 257/668 |
| 6,480,389 B1 | 11/2002 | Shie et al. | |
| 6,493,861 B1 | 12/2002 | Li et al. | |
| 6,555,901 B1 | 4/2003 | Yoshihara et al. | |
| 6,562,647 B2 | 5/2003 | Zandman et al. | |
| 6,607,941 B2 | 8/2003 | Prabhu et al. | |
| 6,614,660 B1 | 9/2003 | Bai et al. | |
| 6,621,163 B2 * | 9/2003 | Weekamp et al. | 257/737 |
| 6,656,827 B1 | 12/2003 | Tsao et al. | |
| 6,713,856 B2 | 3/2004 | Tsai et al. | |
| 6,734,040 B2 | 5/2004 | Yamaguchi et al. | |
| 6,784,020 B2 | 8/2004 | Lee et al. | |
| 6,903,012 B2 | 6/2005 | Geefay et al. | |
| 6,903,883 B2 | 6/2005 | Amanai et al. | |
| 6,982,475 B1 | 1/2006 | MacIntyre | |
| 7,033,664 B2 | 4/2006 | Zilber et al. | |
| 7,265,440 B2 | 9/2007 | Zilber et al. | |
| 2001/0013653 A1 * | 8/2001 | Shoji | 257/738 |
| 2002/0016024 A1 | 2/2002 | Thomas | |
| 2002/0056900 A1 | 5/2002 | Liu et al. | |
| 2002/0159242 A1 | 10/2002 | Nakatani et al. | |
| 2002/0170175 A1 | 11/2002 | Aigner et al. | |
| 2004/0099917 A1 | 5/2004 | Greathouse et al. | |
| 2004/0166662 A1 | 8/2004 | Lei | |
| 2005/0082653 A1 | 4/2005 | McWilliams et al. | |
| 2005/0104179 A1 | 5/2005 | Zilber et al. | |
| 2005/0170656 A1 | 8/2005 | Nasiri et al. | |
| 2006/0044450 A1 | 3/2006 | Wolterink et al. | |
| 2006/0091488 A1 | 5/2006 | Kang et al. | |
| 2006/0110854 A1 | 5/2006 | Horning et al. | |
| 2006/0278997 A1 | 12/2006 | Gibson et al. | |
| 2007/0042527 A1 | 2/2007 | Tuckerman et al. | |
| 2007/0138644 A1 | 6/2007 | McWilliams et al. | |

* cited by examiner

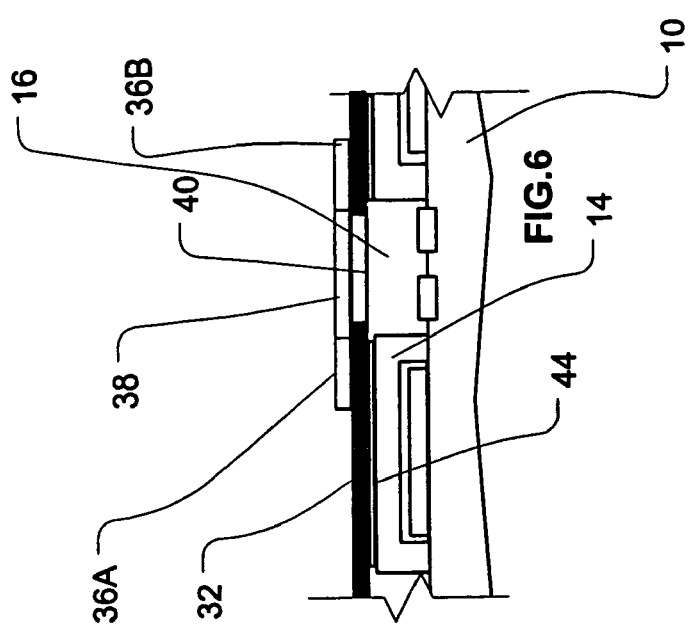
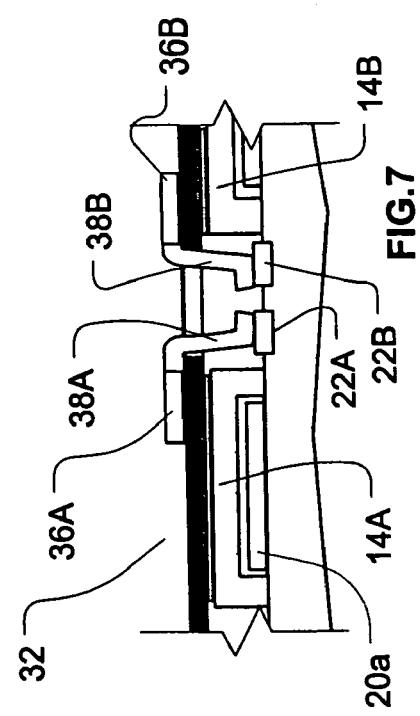
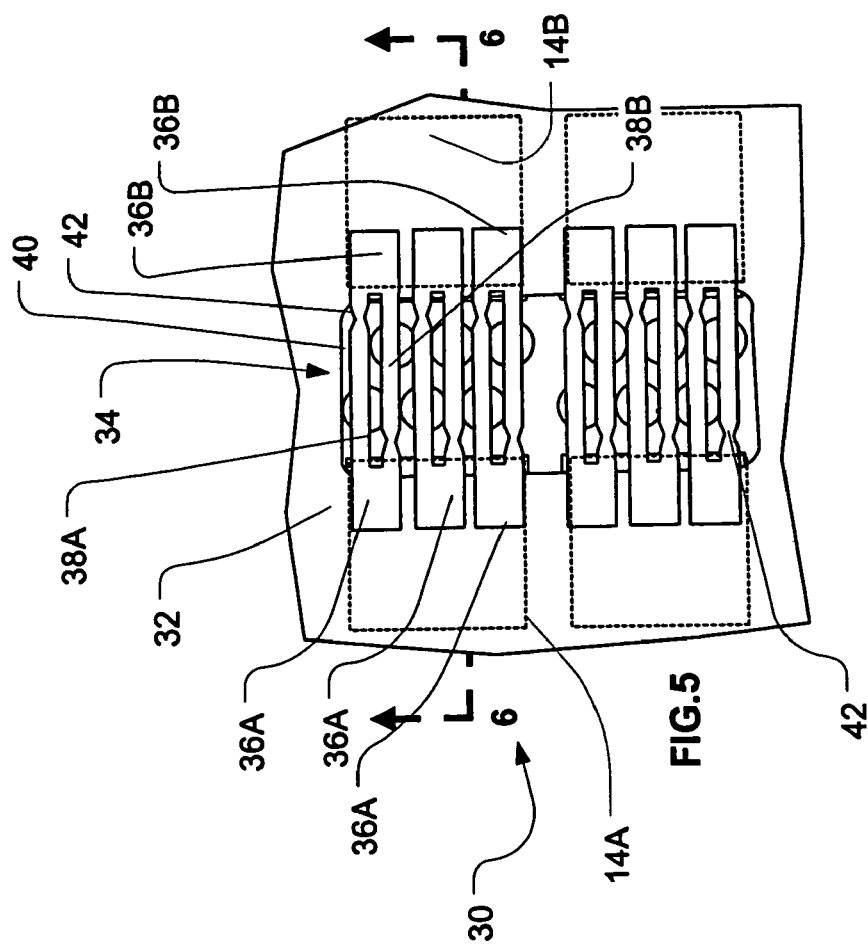

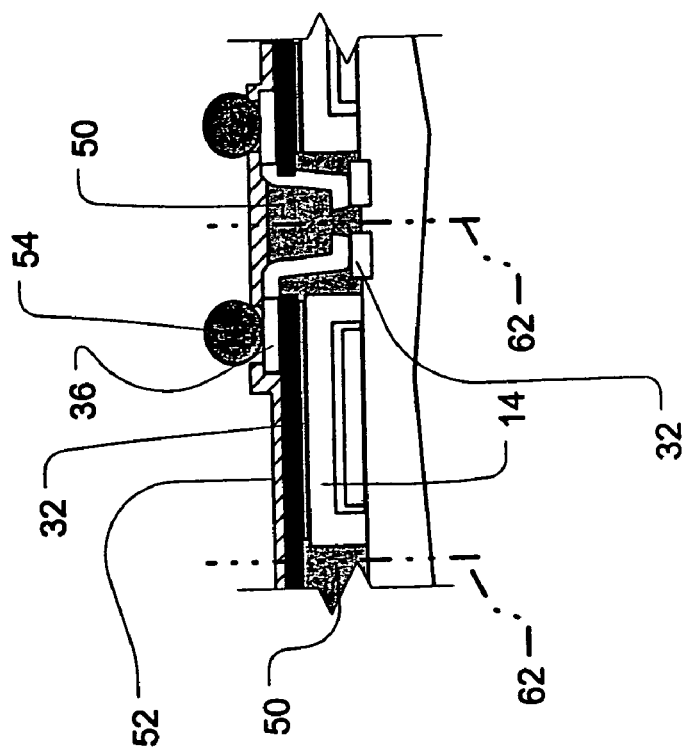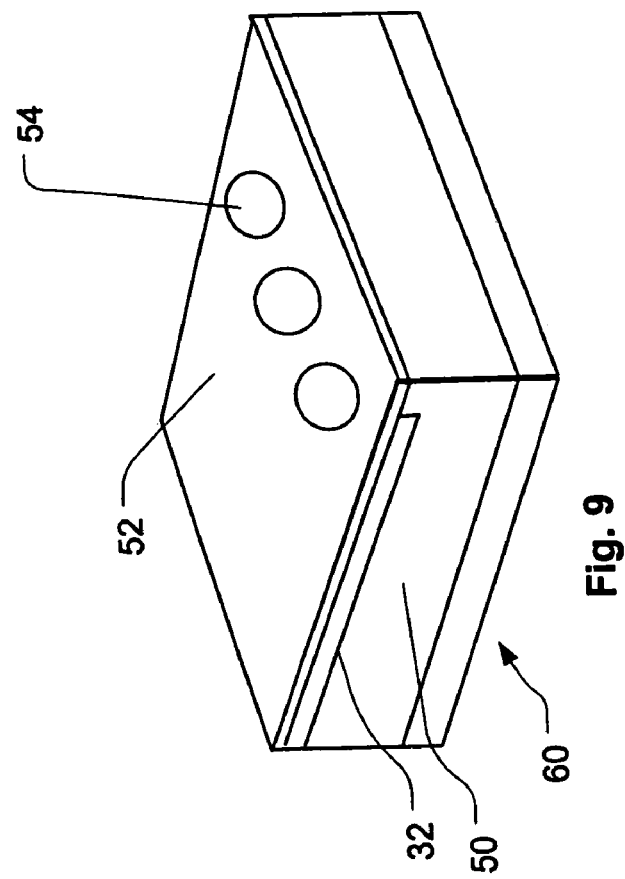

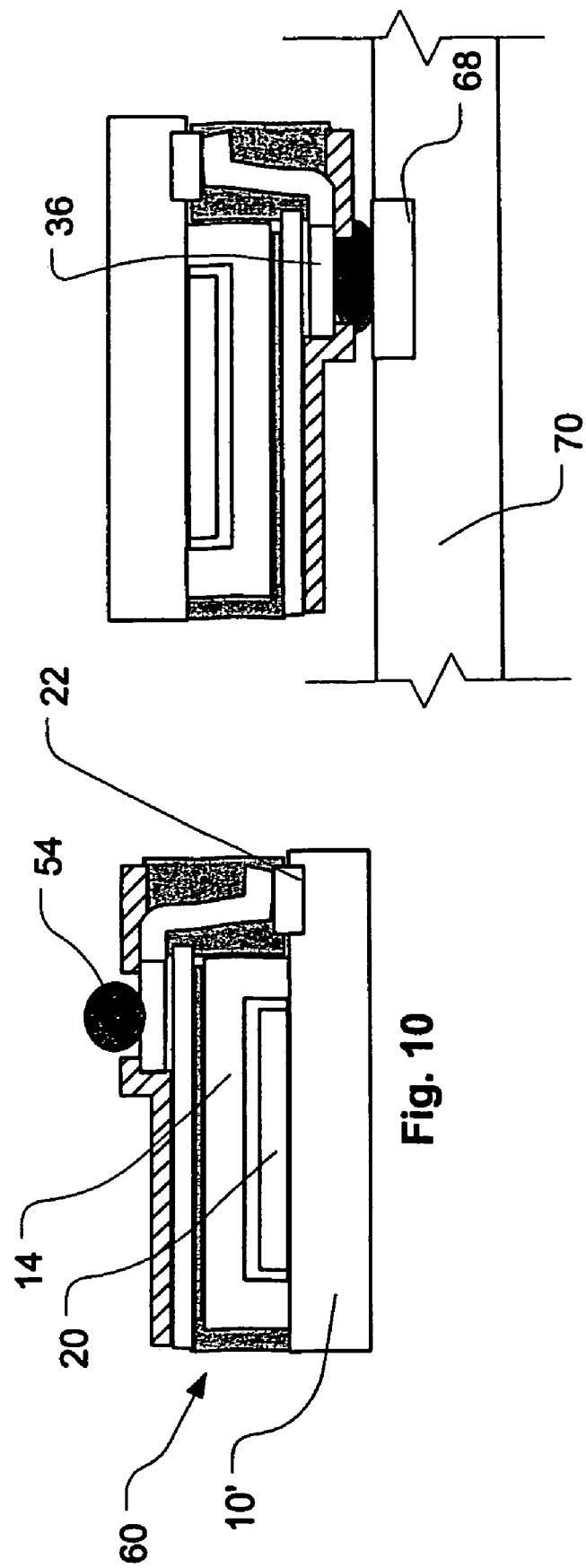

US 7,462,932 B2

MANUFACTURE OF MOUNTABLE CAPPED CHIPS

CROSS-REFERENCE TO RELATED APPLICATIONS

This application is a divisional of U.S. application Ser. No. 10/786,825, filed on Feb. 25, 2004, which in turn claims benefit of U.S. Provisional Patent Application Ser. Nos. 60/449,673, filed Feb. 25, 2003; and 60/456,737, filed Mar. 21, 2003, the disclosures of which are hereby incorporated by reference herein.

BACKGROUND OF THE INVENTION

The present invention relates to microelectronic packaging.

Electronic devices referred to as surface acoustic wave or "SAW" devices process electronic signals in the form of acoustical waves, i.e., minute mechanical vibrations transmitted within the device, typically on an exposed surface region of a mass of a crystalline material. SAW devices are used, for example, as frequency-selective filters and as mixers in analog signal processing. Among other applications, SAW devices are used in radio frequency circuits of cellular telephones and other portable electronic apparatus. SAW devices normally must be provided with a cover or "cap" overlying the acoustically-active region of the surface to protect the active surface from mechanical engagement with surrounding structures and from chemical reaction with the surrounding atmosphere. Likewise, certain micro-electromechanical devices and micro machines incorporate microscopic mechanical elements within an active region of the device. The active regions of these devices must be covered by caps to protect the micromechanical elements. Such devices typically are formed using techniques commonly employed to make conventional microelectronic devices, and are commonly referred to by the acronym "MEMS."

Miniature SAW devices can be made in the form of a wafer formed from or incorporating an acoustically active material such as lithium niobate material. The wafer is treated to form a large number of SAW devices, and typically also is provided with electrically conductive contacts used to make electrical connections between the SAW device and other circuit elements. After such treatment, the wafer is severed to provide individual devices. SAW devices fabricated in wafer form have been provided with caps while still in wafer form, prior to severing. For example, as disclosed in U.S. Pat. No. 6,429,511, a cover wafer formed from a material such as silicon can be treated to form a large number of hollow projections and then bonded to the top surface of the active material wafer, with the hollow projections facing toward the active wafer. After bonding, the cover wafer is polished to remove the material of the cover wafer down to the projections. This leaves the projections in place as caps on the active material wafer, and thus forms a composite wafer with the active region of each SAW device covered by a cap.

Such a composite wafer can be severed to form individual units. The units obtained by severing such a wafer can be mounted on a substrate such as a chip carrier or circuit panel and electrically connected to conductors on the substrate by wire-bonding to the contacts on the active wafer after mounting, but this requires that the caps have holes of a size sufficient to accommodate the wire bonding process. This increases the area of active wafer required to form each unit, requires additional operations and results in an assembly considerably larger than the unit itself.

In another alternative disclosed by the '511 patent, terminals can be formed on the top surfaces of the caps and electrically connected to the contacts on the active wafer prior to severance as, for example, by metallic vias formed in the cover wafer prior to assembly. However, formation of terminals on the caps and vias for connecting the terminals to the contacts on the active wafer requires a relatively complex series of steps.

Similar problems occur in providing terminals for MEMS devices. For these and other reasons, further improvements in processes, and structures for SAW, MEMS and other capped devices would be desirable.

SUMMARY OF THE INVENTION

One aspect of the present invention provides methods of making mountable devices. A method according to this aspect of the invention includes the step of assembling at least a portion of a wafer with a terminal-bearing element incorporating an array of terminals. The wafer portion may include only a part of a wafer such as a single chip or several chips, or may include an entire semiconductor wafer. The wafer portion has a main surface and a multiplicity of spaced-apart caps projecting upwardly from the main surface, so that the wafer portion has channels between the caps. The wafer typically has contacts disposed in the channels. The assembling step serves to mount terminals simultaneously on a plurality of the caps. Methods according to this aspect of the invention desirably also include the step of electrically connecting the terminals mounted on the caps to the wafer by means of leads extending to contacts on the wafer. The terminal-bearing element may include the leads, in which the case the step of electrically connecting the terminals to the contacts on the wafer desirably includes bonding the leads to the contacts. The assembling step may be performed so as to position the leads at least partially in alignment with the channels on the wafer portion. At the conclusion of the assembling step, the leads may extend at a level above the contacts, and the bonding step may include bending the leads downwardly into engagement with the contacts. The leads may be elongated leads, and the assembling step may be performed so that at least some of the leads are aligned with channels extending co-directionally with those leads.

The method may further include the step of severing the wafer or portion of the wafer in the channel so as to form a plurality of units, each such unit including at least one of the caps, at least one of the terminals, and typically a plurality of terminals, as well as the contacts and leads connected to those terminals. The terminal-bearing element used in the process according to this aspect of the invention may include a dielectric layer with terminals and leads supported by the dielectric layer prior to the assembling step. Alternatively, the terminal-bearing element may include a lead frame incorporating the leads and the terminals, most typically without a supporting dielectric layer. The terminal-bearing element may be initially fabricated with at least some of the terminals electrically connected to one another, and the severing step may be performed so as to sever at least some of the connections between terminals.

A method according to a further aspect of the invention includes assembling at least a portion of a wafer with a terminal-bearing element incorporating an array of terminals. In methods according to this aspect of the invention, the wafer or portion of the wafer has a main surface, structure defining an upper surface above the main surface, and depressions extending in to the wafer from the upper surface. As further discussed below, the structure defining the upper surface may include a plurality of spaced-apart caps, as discussed above, which define the depressions as channels extending between the caps. Alternatively, the depressions may be formed in other patterns as, for example, as isolated depressions unconnected with one another. The wafer or portion of the wafer includes contacts disposed in the depressions. Here again, the method desirably includes the step of electrically connecting terminals mounted to the upper surface during the assembling step by means of leads extending to the contacts disposed in the depressions.

As discussed above, the terminal-bearing element desirably also includes the leads, and the assembling step is performed so as to position the leads at least partially in alignment with the depressions. Here again, the method desirably includes severing the wafer or portion of the wafer so as to form a plurality of units. In this embodiment as well, the terminal-bearing element may incorporate a dielectric element with terminals and leads supported by the dielectric element prior to the assembling step, or may incorporate a lead frame including the leads and terminals, most typically without a dielectric element.

Yet another aspect of the invention provides an in-process element. An element according to this aspect of the invention includes a wafer with a main surface, structure defining an upper surface above the main surface, and depressions extending downwardly from the upper surface toward the main surface. The wafer also includes contacts in the depressions. The element according to this aspect of the invention incorporates a terminal-bearing element having a plurality of electrically-conductive terminals overlying the upper surface and secured thereto, as well as a plurality of leads extending into the depressions and connecting the terminals to the contacts. Here again, the structuring defining the upper surface may include a plurality of spaced-apart caps, and the depressions may include channels extending between the caps. An in-process element according to this aspect of the invention may be used during the processes discussed above.

A still further aspect of the invention provides microelectronic devices. A microelectronic device according to this aspect of the invention desirably includes a main body having an active region and contacts, as well as a cap bonded to the main body, the cap covering the active region and defining an upper surface. The device most preferably further includes terminals mounted to the upper surface of the cap, leads extending downwardly from the terminals to the contacts, and an encapsulant surrounding the leads and covering the contacts. The cap may have vertically-extensive edges, i.e., edges which project with at least some component in the vertical direction, upwardly from the main body. The leads desirably are spaced apart from the edges of the cap. The leads may be formed integrally with the terminals. Devices according to this aspect of the invention may be fabricated, for example, by the methods as discussed above.

A microelectronic device according to yet another aspect of the invention again includes a main body with an active region and contacts, as well as a cap bonded to the main body, the cap covering the active region and defining an upper surface. The device according to this aspect of the invention desirably includes a dielectric layer overlying the upper surface of the cap and terminals on the dielectric layer for connecting the device to an external circuit, as well as leads extending downwardly from the terminals to the contacts. The device according to this aspect of the invention desirably includes an encapsulant surrounding the leads and covering the contacts. The dielectric layer may be adhesively bonded to the cap. The devices as discussed above may be fabricated, for example, using the methods and in-process assembly as discussed above. In the devices and methods discussed herein, the active region may be an acoustically active region as, for example, in the case of a surface acoustic wave (SAW) chip, or may be an active region of another type such as a mechanically active region in a micro electromechanical (MEMS) structure.

As further discussed below, particularly preferred methods and device according to the present invention can provide capped chips with terminals disposed on the cap, so that the structure can be handled and mounted like any other microelectronic device having terminals on an exposed surface as, for example, by surface-mounting the device or by incorporating the device in a larger package. Moreover, the most preferred methods provide simple and economical ways of adding the terminals to the devices. These and other objects, features and advantageous of the present invention will be more readily apparent from the detailed description set forth below, taken in conjunction with the accompanying drawings.

BRIEF DESCRIPTION OF THE DRAWINGS

FIG. 5 is a fragmentary top plan view depicting a portion of the wafer and element of FIG. 4.

FIG. 6 is a fragmentary sectional view taken along line 6-6 in FIG. 5.

FIG. 7 is a view similar to FIG. 6, but depicting the wafer and terminal-bearing element at a later stage during the process.

FIG. 8 is a view similar to FIGS. 6 and 7, but depicting the wafer and terminal-bearing element at a still later stage of the process.

FIG. 9 is a diagrammatic perspective view depicting a unit made in the process of FIGS. 3-8.

FIG. 10 is a sectional view of the unit depicted in FIG. 9.

FIG. 11 is a view similar to FIG. 10, but showing the unit in an inverted position and in conjunction with a substrate.

DESCRIPTION OF THE PREFERRED EMBODIMENTS

Figure 3:
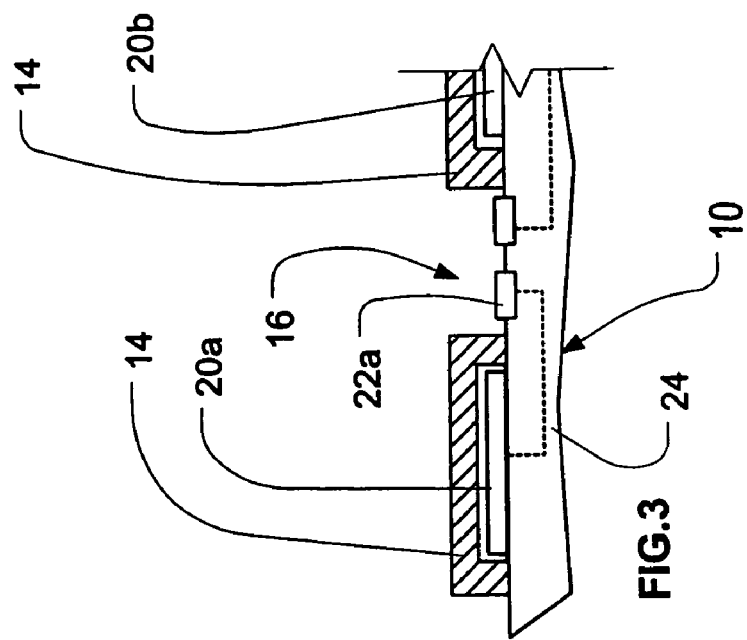
FIG. 3 is a diagrammatic, fragmentary sectional view taken along line 3-3 in FIG. 2.

A process in accordance with one embodiment of the invention starts with a wafer 10 (FIGS. 1-3) having a main surface 12 and a large number of caps 14 projecting upwardly from the main surface. The caps 14 are spaced apart from one another so as to define depressions in the form of channels between the caps. In the particular wafer illustrated, the channels include relatively wide channels 16 extending between some pairs of adjacent caps and relatively narrow channels 18 extending between other pairs of adjacent caps. Wafer 10 has an acoustically active area disposed beneath each cap 14, such as areas 20a and 20b shown in FIGS. 2 and 3. Terminals 22 are provided in sets on wafer 12 within the relatively wide channels 16. A set of terminals associated with each active area is disposed in a wide channel immediately adjacent to the cap 14 covering that active area, so that the terminals 22, active area 20 and cap 14, together with the underlying areas of the main wafer 10 constitute a complete acoustically active device such as a SAW device. For example, terminals 22a are associated with active area 20a, whereas terminals 22b are associated with active area 20b. In the particular arrangement illustrated, two sets of terminals are disposed between each pair of adjacent active areas and each pair of adjacent caps bordering a wide channel 16 on opposite sides thereof. The narrow channels 18 are devoid of terminals. The terminals 22 associated with each active area 20 are electrically connected to the active area by internal connections 24, one of which is schematically shown in FIG. 3.

Figure 1:
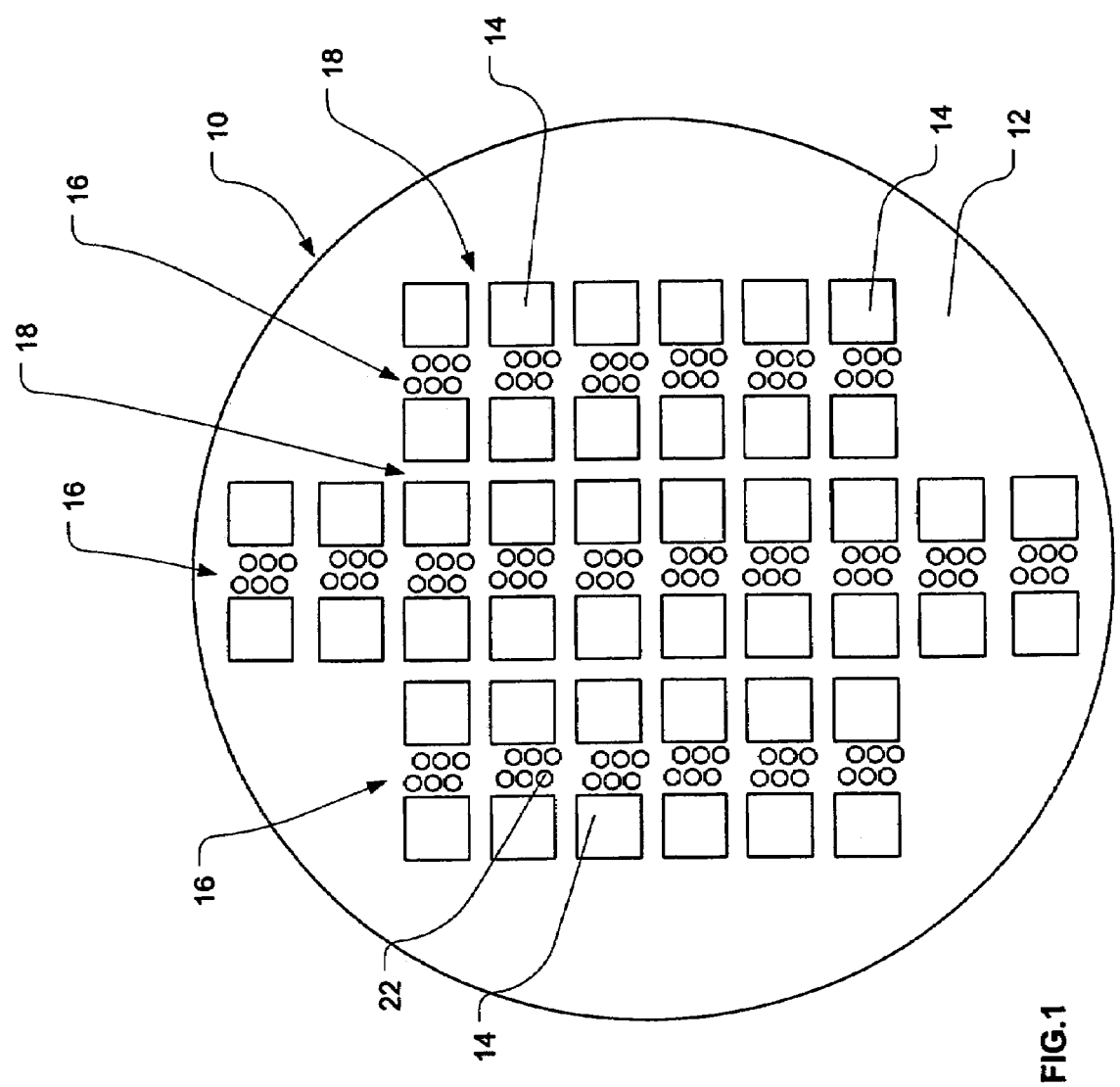
FIG. 1 is a top plan view of a wafer used in a process according to one embodiment of the invention.
Figure 2:
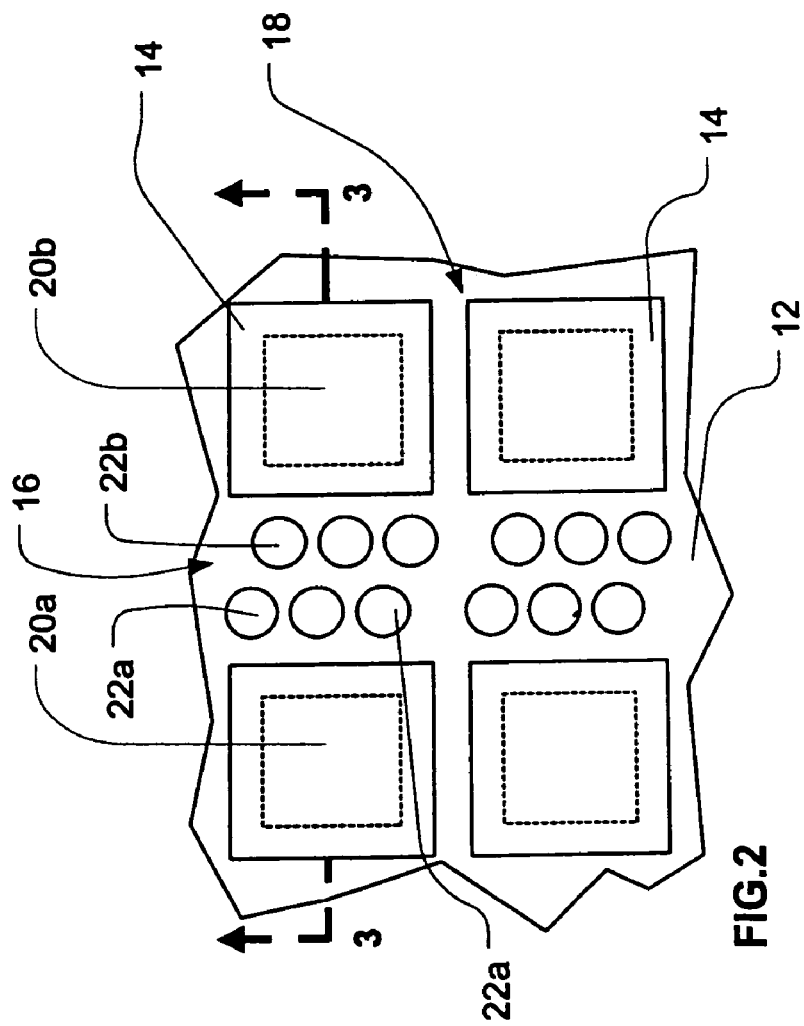
FIG. 2 is a fragmentary view on an enlarged scale depicting a portion of the wafer shown in FIG. 1.

Caps 14 can be formed from essentially any material which will serve the function of protecting the active area. For example, caps 14 may be formed from silicon or other impervious materials and may be bonded to the main surface 12 of the wafer by essentially any conventional process. Merely by way of example, caps 14 can initially be formed as portions of a larger cap wafer (not shown) in a pattern corresponding to the pattern of active areas 20. That wafer may be bonded to main wafer 10 and then polished so as to leave individual caps in place as illustrated in FIGS. 1-3. Also, the structures constituting active regions 20 may be formed from any suitable materials and may be formed integrally with the remainder of wafer 10 or deposited thereon by suitable, known processes. The number of contacts 22 associated with each active area and cap is selected to meet the functional requirements of the device. For typical, simple SAW devices only a few contacts are required for each active area.

In the process, a terminal-bearing element 30 (FIG. 4) is united with wafer 10. The terminal-bearing element in this case is a tape incorporating a unitary dielectric layer 32 with numerous groups 34 of metallic features thereon. As best seen in FIG. 5, each group of metallic features 34 incorporates two sets of terminals 36a and 36b and leads 38 associated with the terminals. Bond windows 40 extend through the dielectric layer 32 in alignment with leads 38. In the particular arrangement shown, leads 38 extend entirely across the bond windows 40. Each lead is permanently connected to a terminal on one side of the bond window and temporarily connected through a frangible section 42 to a terminal on the opposite side of the bond window. Frangible sections 42 are substantially weaker than the remainder of the leads. For example, lead 38a is permanently connected to terminal 36a and temporarily connected by a frangible section of 42 to terminal 36b whereas lead 38b is permanently connected to terminal 36b and temporarily connected by a similar frangible section to terminal 36a.

The terminal-bearing element 30 is assembled to wafer 10 by applying the dielectric layer 32 over the top surfaces of the caps 14. The dielectric layer and hence the terminals may be secured in place by an adhesive 44 disposed between the caps and the dielectric layer 32. The adhesive 44 may be provided in a separate layer with gaps corresponding to the bond windows 40 or may be provided as a part of the terminal-bearing element 30 as, for example, as a layer or a coating on the bottom surface of the dielectric layer. Alternately, the adhesive may be applied by coating the tops of caps 14 with a flowable paste or liquid adhesive, or by applying separate pieces of an adhesive to the tops of the caps. In a further variant, the adhesive 44 is integral with dielectric layer 32 as, for example, where the dielectric layer includes an uncured or partially cured region adjacent its bottom surface. In the assembled condition, the dielectric layer 32 extends over the narrow channels 18 as well as the wide channels 16.

The metallic features 34 and bond windows 40 are arranged on the dielectric layer so that when the terminal-bearing element or tape 30 is applied onto the wafer, the bond windows 40 are aligned with the wide channels 16 and so that the terminals 36 are disposed over or adjacent to the caps. For example, as seen in FIGS. 5 and 6, one set of terminals 36a is disposed of on or adjacent to a cap 14a whereas another set of terminals 36b is disposed on or adjacent to another cap 14b. The leads 38 extend across the wide channels 16. By assembling the tape to the wafer, terminals and leads are assembled to a large number of caps 14 simultaneously. In the particular embodiment shown, the terminals are assembled to all of the caps on the entire wafer in a single operation. In a variant, the tape may cover only a part of the wafer so that the terminals are assembled to only a few caps at a time. In a further variant, the same procedure can be performed using only a portion of the wafer having only a few caps and using a smaller tape.

In the next stage of the process, the leads 38 are bonded to the terminals. The lead bonding process may generally as described in commonly assigned U.S. Pat. Nos. 5,915,752 and 5,489,749, the disclosures of which are incorporated by reference herein. In the lead bonding process, each lead 38 is displaced downwardly by a tool such as a thermosonic bonding tool into engagement with the a contact 22. The frangible sections 42 of the leads are broken in this process. As best seen in FIG. 7, leads 38a associated with terminals 36a overlying cap 14a are bonded to contact set 22a associated with cap 14a and the corresponding active element 20a whereas leads 38b associated with terminals 36b are bonded to contacts 22b associated with cap 14b and its active element. Thus, the terminals mounted on each cap are connected to the contacts associated with that cap.

In the next stage of the process, an encapsulant 50 (FIG. 8) is introduced into the channels 16 and 18 so that the encapsulant surrounds the caps 14 and the leads 38, and covers the contacts 22. Appropriate measures are taken to prevent the encapsulant from flowing onto the terminals 36. For example, a cover layer 52 formed from a conventional solder mask material may be provided over the top surface of the dielectric layer so that the cover layer 52 bridges over the bond windows in the dielectric layer. The cover layer is provided with openings aligned with terminals 36. As discussed below, the cover layer remains as part of the devices formed in the process. Alternatively, the cover layer 52 may be omitted and replaced by a permanent fixture (not shown) which temporarily engages the dielectric layer to bridge the bond windows.

Figure 4:
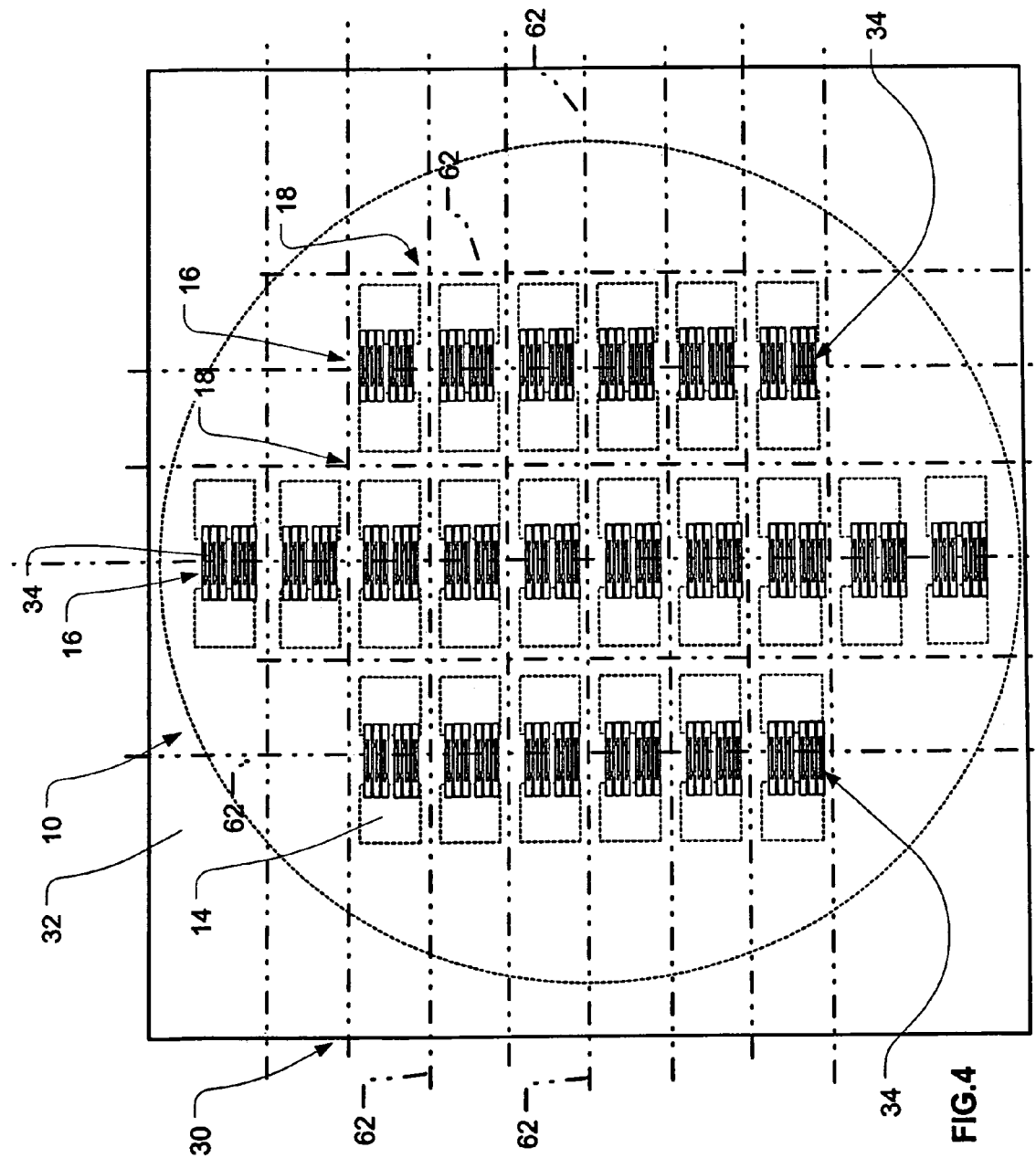
FIG. 4 is a diagrammatic top plan view depicting the wafer of FIG. 1 in conjunction with a terminal-bearing element during a process in accordance with one embodiment of the invention.

In the next stage of the process, masses of bonding material such as conventional solder balls 54 are applied on terminals 36. Before or, preferably, after application of the solder balls, the assembly is severed to form individual units 60 (FIGS. 9 and 10) by severing the wafer along the various channels as indicated by severance lines 62 (FIGS. 4 and 8). Each unit 60 includes a main body 10' formed from a portion of wafer 10 incorporating one active region 20, the cap 14 associated with that active region and the contacts 22 associated with the same active region. Each unit 60 further includes terminals 36 disposed over or near the cap 14, supported by the top surface of the cap, the terminals being electrically connected to the contacts 22 of the unit. Each unit further includes encapsulant surrounding the leads 38 of the unit. Each unit constitutes a packaged capped chip and can be handled and mounted using techniques commonly used for handling and mounting packaged semiconductor chips. Ordinary surface-mounting techniques and be used as, for example, by bonding the terminals 36 to contact pads 68 on a circuit panel 70 so as to mount the assembly in "flip-chip" orientation with the terminals 36 and the top surface of the cap 14 facing downwardly toward the circuit panel (FIG. 11). In a further variant, the solder balls 54 may be omitted and the unit may be mounted either face-up or face-down on a substrate as, for example, by wire bonding the terminals 36 to contact pads of a substrate. In yet another variant, the unit can be further packaged, with or without other chips or devices, to form a module which, in turn, can be mounted to a circuit panel.

The assembly process discussed above provides an economical way of assembling terminals to a wafer having upwardly projecting caps. The finished assembly provides a capped device, such as an acoustically active device or MEMS device with the capability for mounting to a larger circuit panel.

Figure 12:
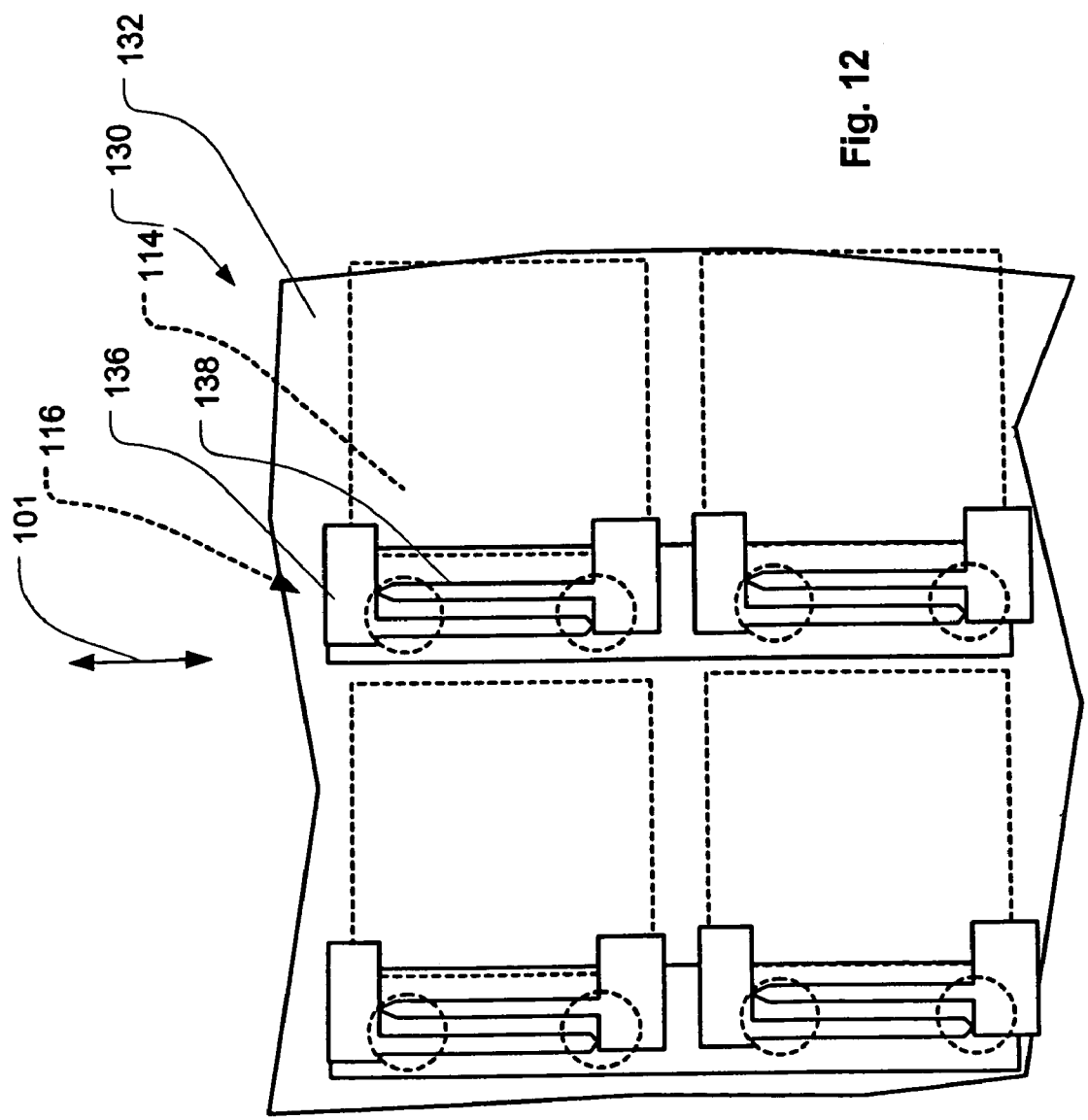
FIG. 12 is a fragmentary top plan view similar to FIG. 5, but depicting a portion of a wafer and terminal-bearing element in accordance with a further embodiment of the invention.

In a process according to a further variant (FIG. 12) the lead-bearing element has terminals 136 and elongated leads 138 arranged so that when the terminal-bearing element 130 is disposed on the wafer, the leads 138 are disposed over channels 116 between adjacent caps 114 and the direction of elongation of each lead is generally co-directional with the channel underlying the lead. Stated another way, in FIG. 12, lead 138 is elongated in the direction indicated by arrow 101 and channel 116 extends in the same direction.

The arrangement of leads co-directionally with the channels provides relatively long leads in relatively narrow channels. Long leads, in turn, can be displaced downwardly to a greater depth and hence can accommodate relatively thick caps 114. Also, in the arrangement of FIG. 12, the terminals project outwardly over channels 116 from caps 114. Moreover, each channel 116 accommodates only a single row of contacts associated with a single cap 114.

Figure 16:
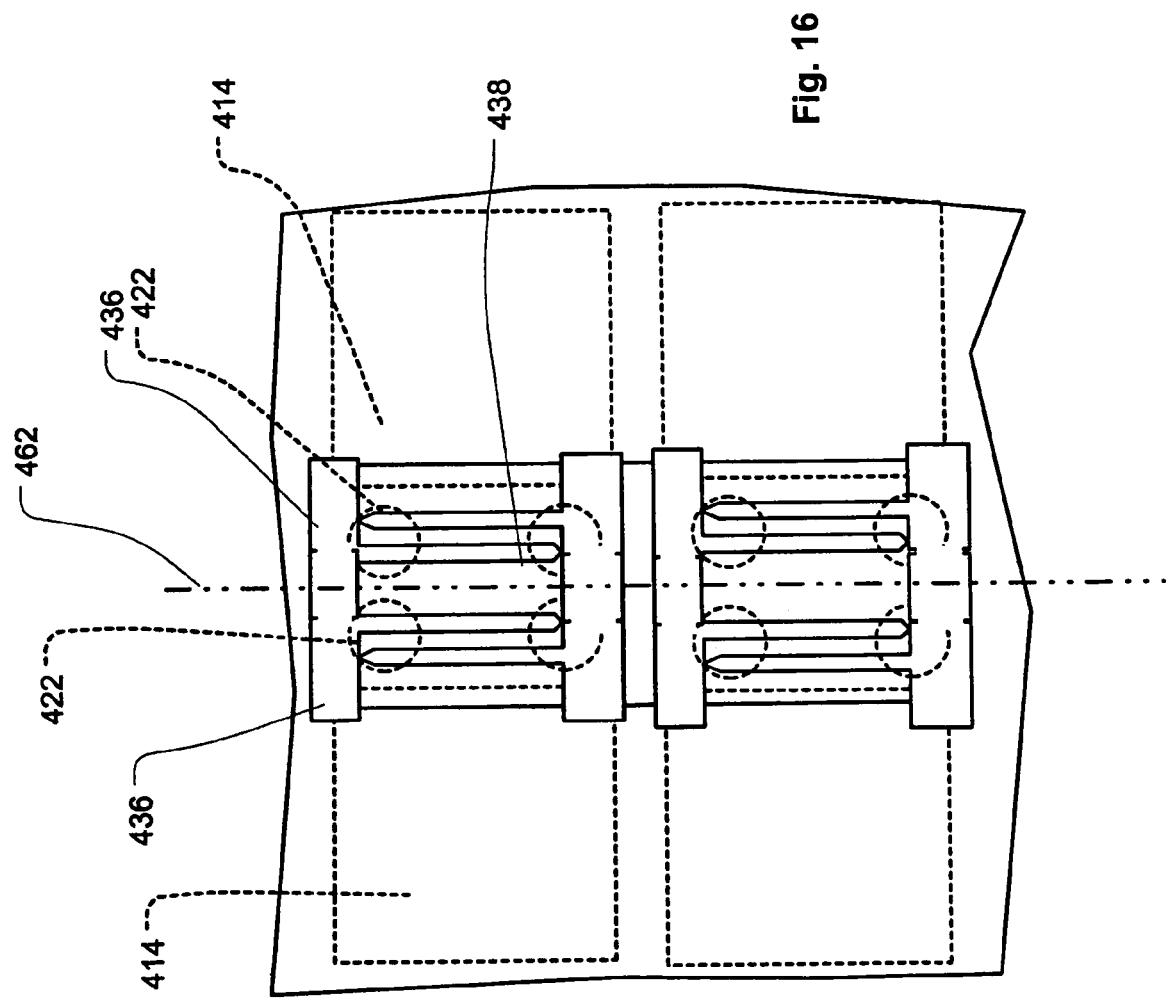
FIG. 16 is a view similar to FIGS. 12 and 13, but depicting portions of a wafer and terminal-bearing element during a process according to yet another embodiment of the invention.

In an alternative embodiment, depicted in FIG. 16, similar leads 438 can be used where two rows of contacts 422 are provided in a single channel 416, associated with two caps 414 disposed on opposite sides of the channel. Terminals 436 can be provided in pairs as shown. In the terminal-bearing element or chip carrier as originally provided, the terminals of each pair are formed as a unitary body. These bodies are severed so as to separate the terminals 436 of each pair when the wafer and chip carrier are severed along severance lines 462.

Figure 13:
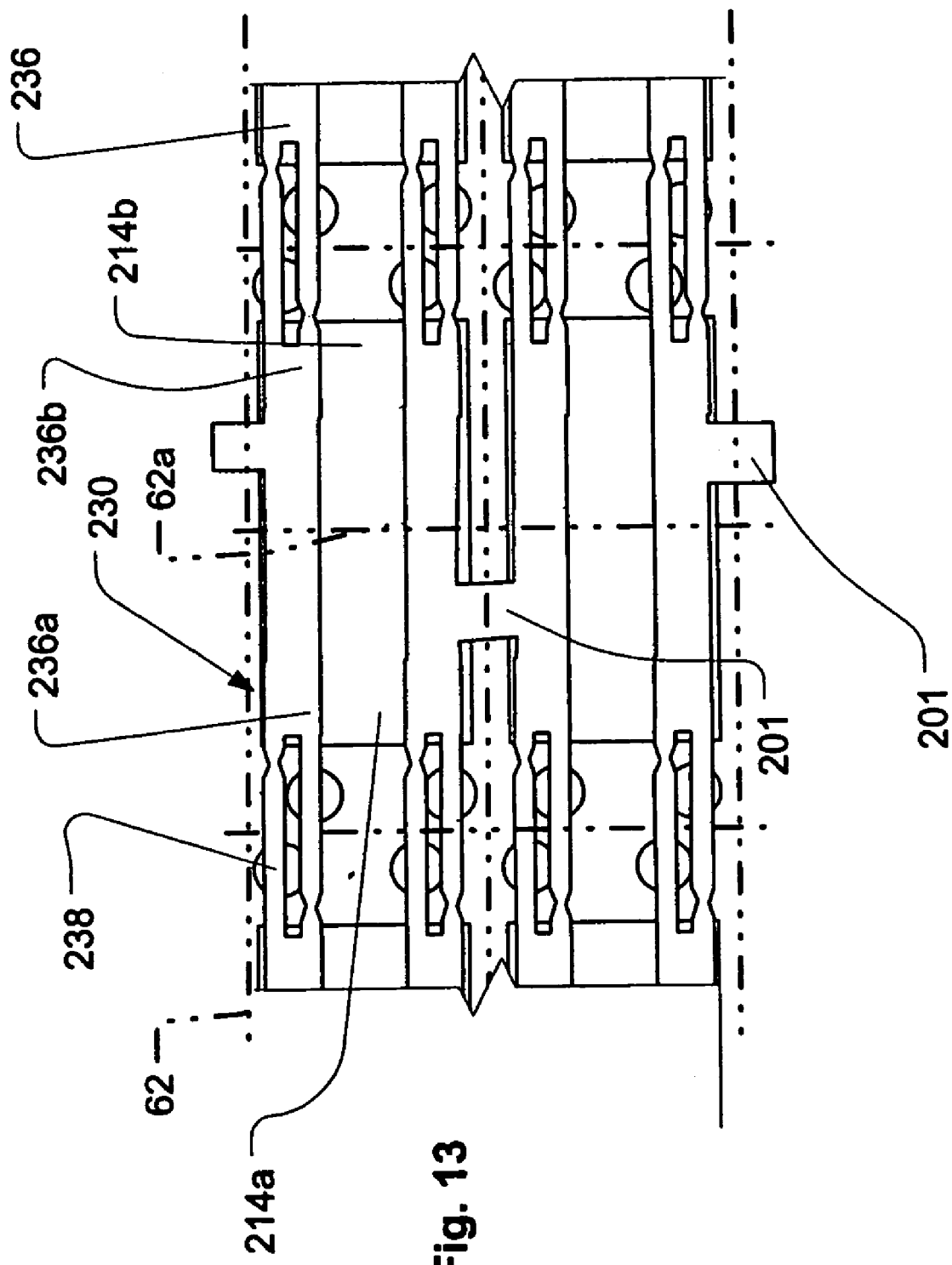
FIG. 13 is a further view similar to FIG. 12, but depicting portions of a wafer and terminal-bearing element in accordance with yet another embodiment of the invention.

In a further variant, shown in FIG. 13, the terminal-bearing element 230 is a lead frame composed entirely of metallic elements including leads 238 and terminals 236 similar to those discussed above. In the arrangement of FIG. 13, the terminal-bearing element does not include a dielectric layer or tape. The metallic elements are interconnected to one another by temporary bridge elements 201. Only a few of the temporary bridge elements are visible in FIG. 13. The bridge elements hold the metallic elements together in a self-supporting frame or network. When the wafer is severed to form the individual units, bridge elements 201 are cut. Stated another way, when the frame is assembled to the wafer, the bridge elements 201 extend across severance lines 62. Additionally, some of the terminals are integral with one another, such as terminals 236a and 236b, and these terminals are separated from one another when the wafer is severed along severance lines 62a. In the arrangement of FIG. 13, some of the caps are formed integrally with one another. For example, cap 214a is integral with cap 214b and these caps are separated from one another when the wafer is severed along line 62a. Here again, severance of the wafer forms individual units, each incorporating a single acoustically active device with the associated cap, contact terminals and leads. In a further variant, each of the individual units formed by the severing, operation may include two or more acoustically active devices with a single cap or with two or more separate caps.

Figure 14:
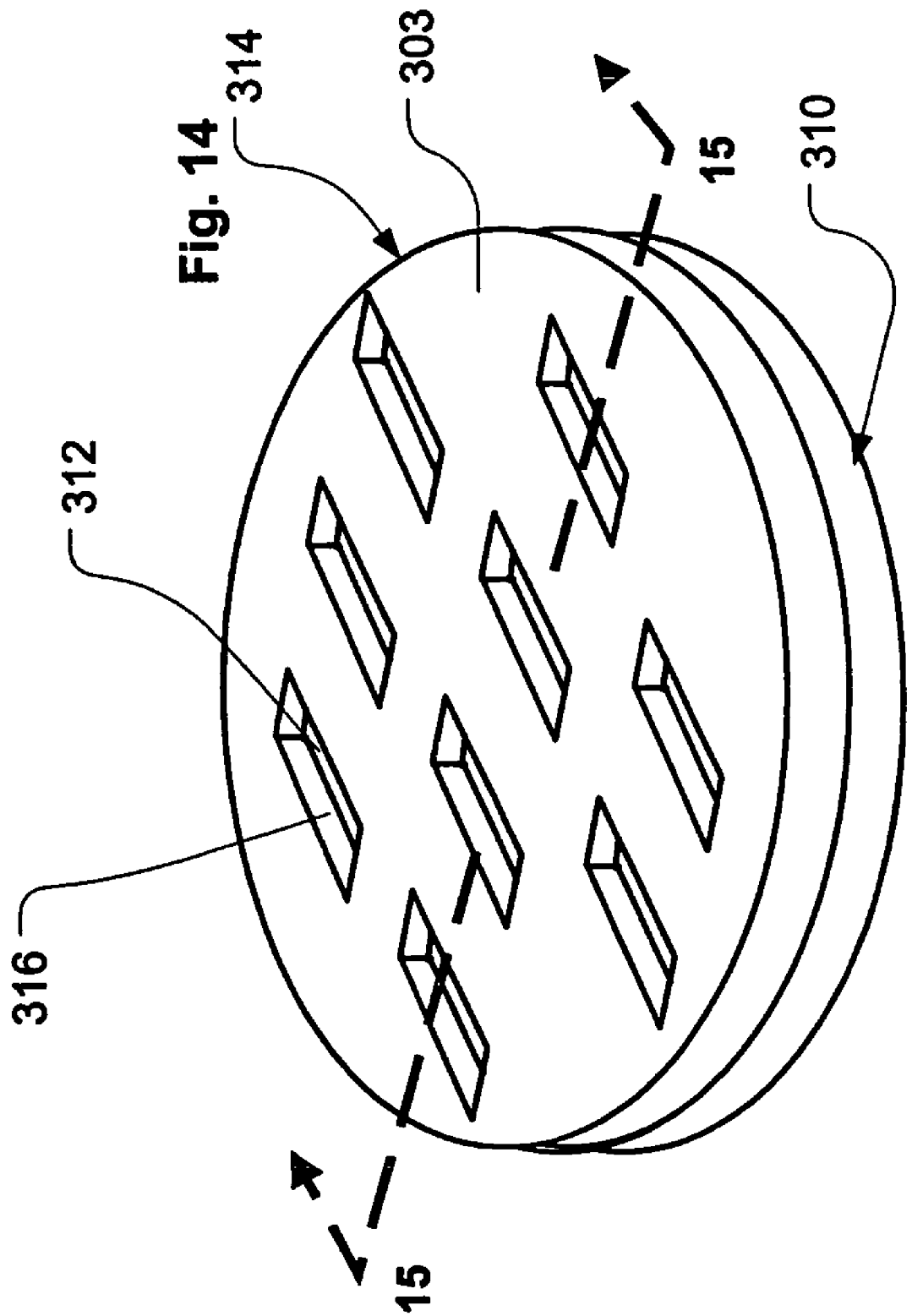
FIG. 14 is a diagrammatic perspective view depicting a wafer used in a process according to yet another embodiment of the invention.
Figure 15:
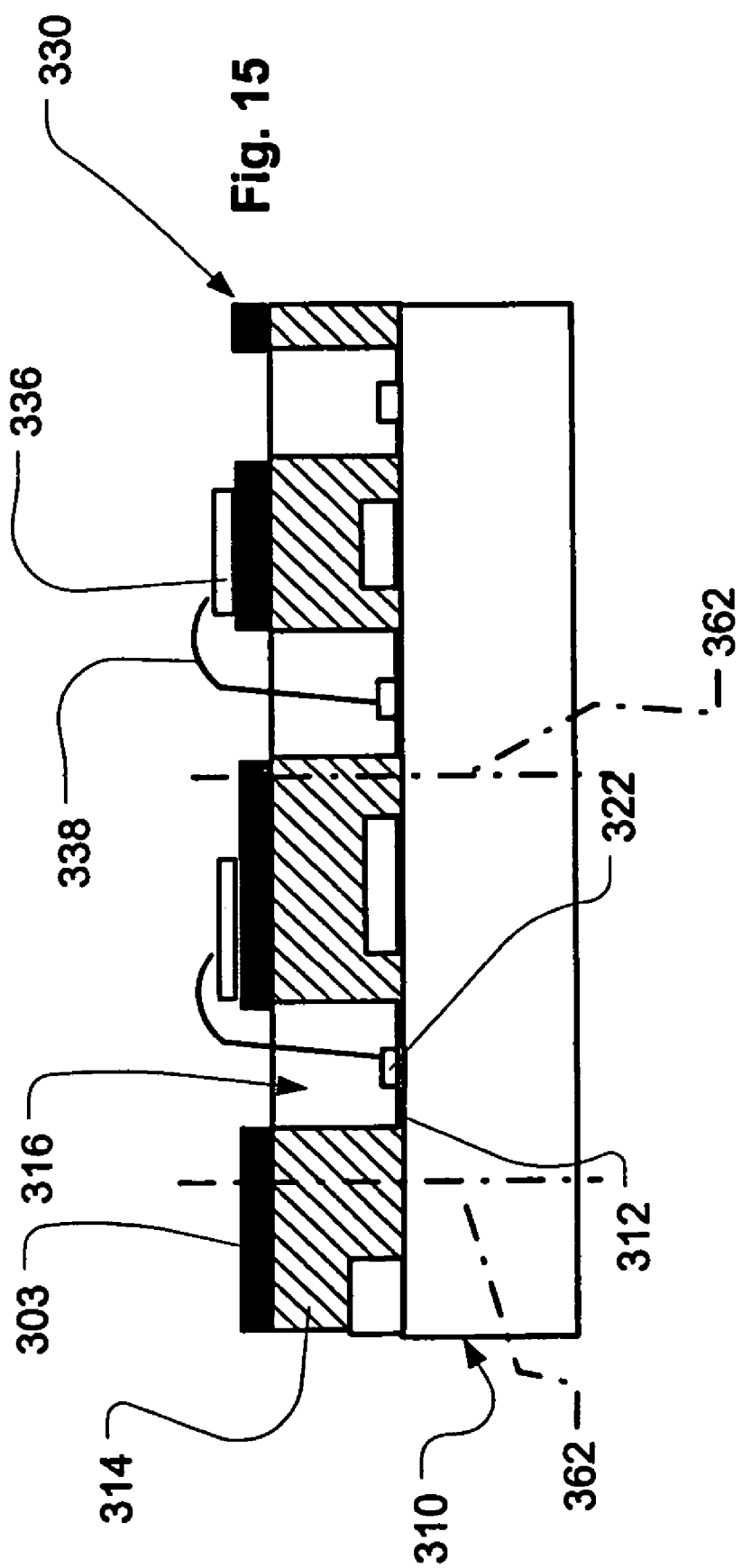
FIG. 15 is a diagrammatic, fragmentary sectional view depicting portions of the wafer shown in FIG. 14 in conjunction with a terminal-bearing element during a process according to yet another embodiment of the invention.

In a further variant (FIGS. 14 and 15), all of the caps are integral with one another and form a continuous cap wafer with depressions 316 therein such that the main surface 312 of wafer 310 is exposed only within spaced-apart depressions 316. Stated another way, the upper or capping wafer 314 defines a continuous upper surface 303 whereas the contacts 322 of the wafer are disposed of at a lower level defined by the main surface 312 in depressions 316. The terminal-bearing element 330 is mounted on the upper surface 303. The terminals 336 on the terminal-bearing element are connected by leads connecting downwardly into the depression 316, to the contacts 322 at main surface or level 312. Also, in this arrangement the leads are formed by wire bonds 338 added in a separate operation, after application of the terminal-bearing element 330. Here again, the wafer can be severed by cutting along severance lines 362 (FIG. 15) to form individual units. The severance lines need not extend through the depressions 316. Stated another way, in the finished units, the contacts 322 and leads 338 do not lie at the edges of the unit.

The features shown in the various embodiments can be combined with one another. For example, the wire-bonding technique and unitary cap wafer discussed with reference to FIGS. 14 and 15 can be used with the other embodiments discussed above.

The techniques and structures discussed herein can be applied to packaging of acoustically active devices such as SAW devices, MEMS devices and other structures having caps. Also, in the discussion above, the elements projecting upwardly from the main surface are referred to as "caps" because they cover the active elements of the devices. However, the caps themselves can be active parts of the device. Stated another way, the term cap as used herein also includes a mesa formed from active semiconductor material or other material and forming an active part of the device. Thus, the invention can be applied in fabrication of devices other than acoustically active devices and MEMS devices; it can be used with any wafer which incorporates upwardly projecting mesas or, conversely, structure defining an upper surface with depressions extending downwardly to a lower, main level and with contacts in such depressions.

The foregoing description should be taken by way of illustration rather than by way of limitation of the present invention. Certain aspects of the present invention are described in the appended claims.

The invention claimed is:

1. An in-process element comprising:
    (a) a wafer with a main surface, structure defining an upper surface above said main surface and depressions extending downwardly from said upper surface toward said main surface, the wafer also having contacts in said depressions;

(b) a terminal-bearing element having a plurality of electrically-conductive terminals overlying said upper surface and secured thereto, the terminal-bearing element including a plurality of leads extending over said contacts in a direction aligned with said upper surface, such that said leads bridge said depressions.

2. An element as claimed in claim 1 wherein said structure defining said upper surface includes a plurality of spaced-apart caps and said depressions include channels between said caps.

3. A microelectronic device comprising:
(a) a main body having an active region and contacts;
(b) a cap bonded to said main body, said cap covering said active region and defining an upper surface, said cap having edges extending from said upper surface to said main body;
(c) terminals mounted to said upper surface of said cap;
(d) leads formed integrally with said terminals extending downwardly from said terminals to said contacts; and
(e) an encapsulant surrounding said leads and covering said contacts.

4. A device as claimed in claim 3 wherein said active region is acoustically active.

5. A microelectronic device comprising:
(a) a main body having an active region and contacts;
(b) a cap bonded to said main body, said cap covering said active region and defining an upper surface;
(c) a dielectric layer overlying said upper surface of said cap;
(d) terminals on said dielectric layer for connecting the device to an external circuit; and
(e) leads formed integrally with said terminals extending downwardly from said terminals to said contacts.

6. A device as claimed in claim 5 further comprising an encapsulant surrounding said leads and covering said contacts.

7. A device as claimed in claim 5 wherein said dielectric layer is adhesively bonded to said cap.

8. A SAW device assembly comprising:
(a) a main body having an acoustically-active region and contacts;
(b) a cap bonded to said main body, said cap covering said active region and defining an upper surface;
(c) terminals mounted on said upper surface of said cap;
(d) leads formed integrally with said terminals connecting said terminals and to said contacts; and
(e) a circuit panel having contact pads thereon, said main body and cap overlying said circuit panel with said upper surface of said cap and said terminals facing toward said circuit panel, said terminals being bonded to said contact pads.

9. A MEMS device assembly comprising:
(a) a main body having an active region with micromechanical elements and contacts;
(b) a cap bonded to said main body, said cap covering said active region and defining an upper surface;
(c) terminals mounted on said upper surface of said cap;
(d) leads formed integrally with said terminals connecting said terminals to said contacts; and
(e) a circuit panel having contact pads thereon, said main body and cap overlying said circuit panel with said upper surface of said cap and said terminals facing toward said circuit panel, said terminals being bonded to said contact pads.

* * * * *

UNITED STATES PATENT AND TRADEMARK OFFICE
CERTIFICATE OF CORRECTION

PATENT NO. : 7,462,932 B2  
APPLICATION NO. : 11/642354  
DATED : December 9, 2008  
INVENTOR(S) : Belgacem Haba and Yoichi Kubota It is certified that error appears in the above-identified patent and that said Letters Patent is hereby corrected as shown below:

Title page, Item 74, "Litenberg," should read --Littenberg,--  
Column 3, line 4, "example, as isolated" should read --example, isolated--  
Column 5, line 47, "typical, simple" should read --example, with simple--  
Column 6, line 8, "example, as a layer" should read --example, a layer--  
Column 6, line 21, "channels 16 and so" should read --channels 16 so--  
Column 6, line 36, "generally as described" should read --generally be described--  
Column 7, line 14, "techniques and be" should read --techniques can be--  
Column 8, line 15, "severing, operation" should read --severing operation--  
Column 10, line 15, "terminals and to" should read --terminals to--

Signed and Sealed this

Twelfth Day of January, 2010

David J. Kappos  
*Director of the United States Patent and Trademark Office*